United States Patent
Franz

(10) Patent No.: US 8,747,627 B2
(45) Date of Patent: Jun. 10, 2014

(54) METHOD AND DEVICE FOR REVERSING THE FEEDING OF SPUTTER COATING SYSTEMS IN CLEAN ROOMS

(75) Inventor: Roland Franz, Fuenfstetten (DE)

(73) Assignee: Grenzebach Maschinenbau GmbH, Asbach-Baeumenheim (DE)

(*) Notice: Subject to any disclaimer, the term of this patent is extended or adjusted under 35 U.S.C. 154(b) by 340 days.

(21) Appl. No.: 13/131,167

(22) PCT Filed: Nov. 26, 2009

(86) PCT No.: PCT/DE2009/001680
§ 371 (c)(1),
(2), (4) Date: May 25, 2011

(87) PCT Pub. No.: WO2010/063264
PCT Pub. Date: Jun. 10, 2010

(65) Prior Publication Data
US 2011/0226612 A1  Sep. 22, 2011

(30) Foreign Application Priority Data
Dec. 1, 2008 (DE) .................. 10 2008 059 794

(51) Int. Cl.
*C23C 14/34* (2006.01)
(52) U.S. Cl.
USPC ............ 204/192.12; 204/192.13; 204/298.03; 204/298.15; 204/298.25; 118/719; 118/729; 118/730
(58) Field of Classification Search
USPC ............ 204/298.15, 298.25, 192.12, 192.13, 204/298.03; 118/719, 729, 730
See application file for complete search history.

(56) References Cited

U.S. PATENT DOCUMENTS

| | | | |
|---|---|---|---|
| 2,748,026 | A | 5/1956 | Ogle, Jr. |
| 5,400,317 | A | 3/1995 | Strasser et al. |
| 6,123,494 | A | 9/2000 | Henrich et al. |
| 7,464,622 | B2 | 12/2008 | Markert et al. |
| 2002/0078892 | A1 | 6/2002 | Takahashi |
| 2005/0081791 | A1 | 4/2005 | Lindenberg et al. |
| 2007/0231111 | A1 | 10/2007 | Heimel et al. |

FOREIGN PATENT DOCUMENTS

| | | |
|---|---|---|
| CN | 1109107 A | 9/1995 |
| CN | 1377212 A | 10/2002 |
| DE | 197 15 151 A1 | 10/1998 |
| DE | 695 04 716 T2 | 5/1999 |
| DE | 2008 004 228 U1 | 7/2008 |

(Continued)

OTHER PUBLICATIONS

Chinese Office Action for Serial No. 200980145737.X, Dated Oct. 10, 2012 and English Translation.

(Continued)

*Primary Examiner* — Rodney McDonald
(74) *Attorney, Agent, or Firm* — Brinks Gilson & Lione

(57) ABSTRACT

The invention relates to a method and to a device for reversing the feeding of a sputter coating system, particularly when coating a photovoltaic module, in clean rooms, having the following characteristics: a) a transport frame (11) for receiving a substrate wafer (19) of a photovoltaic module, b) a rotary device having means for mounting the transport frame (11), having means for rotating the transport frame (11), and having means for transporting the transport frame (11), c) means for precisely aligning the rotary device relative to the sputter coating system, d) a detection device (18) for checking a sputter process, and computer program having a program code for performing the process steps.

14 Claims, 5 Drawing Sheets

(56) References Cited

FOREIGN PATENT DOCUMENTS

| DE | 10 2007 009 924 A1 | 8/2008 |
| EP | 0 665 193 A2 | 8/1995 |
| EP | 1 541 296 A1 | 12/2004 |
| JP | 7-235486 | 9/1995 |
| JP | 2006-191039 | 7/2006 |
| JP | 2007-126703 | 5/2007 |

OTHER PUBLICATIONS

Japanese Office Action for Serial No. 2011-537844. Dated Oct. 23, 2012.
German Office Action with English Translation, Dated Jun. 3, 2009.
International Search Report for International Application No. PCT/DE2009/001680, Dated Apr. 14, 2010.

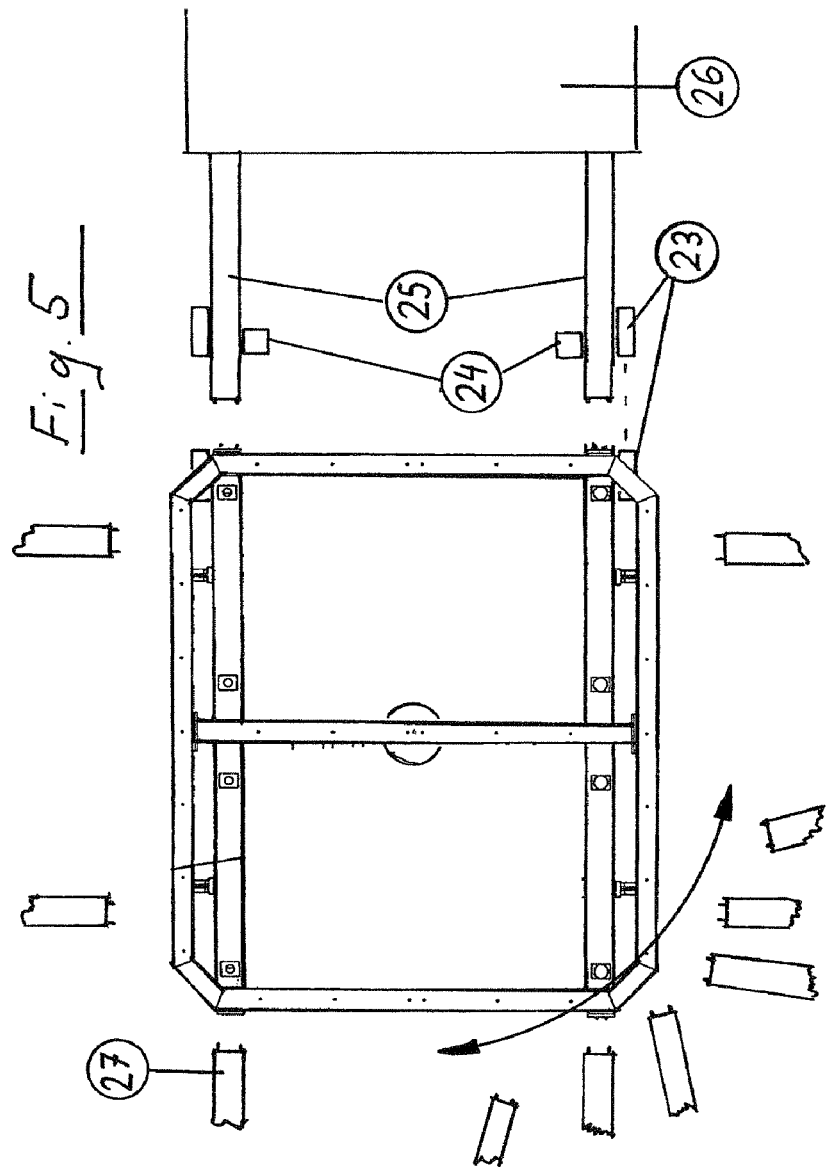

METHOD AND DEVICE FOR REVERSING THE FEEDING OF SPUTTER COATING SYSTEMS IN CLEAN ROOMS

CROSS REFERENCE TO RELATED APPLICATIONS

This application is a national stage application under 35 U.S.C. 371 of international application number PCT/DE2009/001680 filed Nov. 26, 2009 (WO 2010/063264 A1) and also claims priority to German application number 10 2008 059 794.5 filed Dec. 1, 2008, all of which are hereby incorporated by reference in their entirety.

SUMMARY

The invention relates to a device and a method for reversing the feeding of sputter coating systems.

A large number of technical devices appertaining to our everyday necessities require a sputter coating during production. We find these layers in hard disks of computers, CD storage media and LCD flat screens, sputter bearings, modern thermal protective glass, mirrors, halogen emitters or automobile headlights. All these useful things cannot be realized without coatings by means of sputtering.

The English expressions "to sputter", "sputtering" denote the process of cathode sputtering. In this case, argon ions impinge on a cathode (the so-called target), at which a typical electrical voltage of 500 volts is present. When the ions impinge, atoms are released from the cathode and condense in the surroundings, which leads to the growth of a layer. Important components for sputter coating are the so-called magnetrons (a cathode with integrated magnetic system) and a vacuum chamber (receiver chamber).

In many cases, the material to be coated is large glass sheets.

The production and further processing of such large shock-sensitive sheets is also required in the production of flat screens of relatively large design and in a large quantity.

Modern flat screens are increasingly replacing the old tube monitors and are also becoming less and less expensive.

They are based on TFT/LCD technology. In this context, LCD (liquid crystal display) represents the use of liquid crystals in the individual pixels of the screen, and TFT stands for thin film transistor. The TFTs are very small transistor elements which control the orientation of the liquid crystals, and therefore the light transmission thereof.

A flat screen display consists of numerous pixels. Each pixel in turn consist of 3 LCD cells (subpixels), corresponding to the colors red, green and blue. A 15-inch screen (measured diagonally) contains about 800 000 pixels or approximately 2.4 million LCD cells.

However, photovoltaic elements also require sputter systems for their production. Modern glass facades are indisputable sign of modern architecture. However, in many cases they are not just a functional element of a structure, but in fact also serve increasingly for generating solar power. Tailored solar modules make accurate integration into building grids and profiles possible. Semitransparent solar cells, but also opaque solar cells with transparent areas, make photovoltaic glazings appear to be flooded with light. Here, the solar cells often take on the desired effect of protection against the sun and glare.

The production of such photovoltaic systems requires operating conditions such as those which are conventional primarily in the production of semiconductors and integrated electronic circuits. However, in the production of photovoltaic systems, these so-called clean room conditions additionally make it necessary to handle shock-sensitive glass sheets with a large surface area.

The production both of photovoltaic elements and of TFT screens requires so-called clean rooms.

A clean room, or an ultraclean room, is a room in which the concentration of airborne particles is controlled. It is constructed and used in such a way that the number of particles introduced into the room or produced and deposited in the room is as small as possible, and other parameters, such as temperature, humidity or air pressure, are controlled as required.

However, the production of large screens requires special machines even in ultraclean rooms to handle the large-surface-area, thin glass sheets required in this case.

For this purpose, it is possible to use primarily multi-axial industrial robots. The use of a wide variety of embodiments of multi-axial industrial robots in technology for producing a wide variety of products can be gathered from the prior art.

Industrial robots of this type are used in large halls mostly for transporting unwieldy and heavy loads, but can also be used beneficially in the production of smaller machine parts. What matters in all cases is the reproducible precision of the movement sequences of the individual grasping operations, transport movements and setting-down operations.

Here, the circumstances under which these movement sequences take place are unimportant in many cases. For example, it is mostly immaterial what noise emission such a movement sequence causes, or whether such an operation is associated with movements of dust or a greater or lesser escape of lubricant. Unavoidable abrasion of moving machine parts which cause friction is also mostly insignificant.

By contrast, natural ramifications of this type must be taken into consideration when working in an environment at risk from contamination, for example in the food-processing industry, in the pharmaceutical industry or even in the production of semiconductors in clean rooms.

Thus, EP 1 541 296 A1 discloses a manipulator, such as an industrial robot, for use in an environment at risk from contamination, having a number of scavenging chambers, which can be charged with a scavenging medium, in the region of drive units of the manipulator. The problem to be solved in the case of such a device is to further develop the device to such an extent that the manipulator can safely be used in an environment at risk from contamination in a structurally simple manner and therefore, in particular, at low cost. This problem is solved by a dedicated scavenging chamber being associated with each of a plurality of groups of drive units (claim 1).

Although the environment in which such an industrial robot is intended to be used is more sensitive to contamination and therefore also places higher demands on the design configuration by comparison with a normal environment, special demands of this type cannot be compared with the conditions stipulated in clean rooms.

DE 10 2007 009 924 A1 furthermore discloses a continuous coating system, a method for producing crystalline thin films and solar cells, and also a solar cell.

This known continuous coating system addresses the problem of providing a continuous coating system which is suitable for the deposition of high-quality crystalline thin films and is suitable for the mass production of high-quality crystalline silicon layers, wherein the number of necessary process steps is not very high.

This problem is solved by means of a continuous coating system comprising a) a vacuum chamber having a supply opening for supplying a substrate to be coated and a discharge opening for discharging the coated substrate, b) a physical vapor deposition unit for coating a surface of the substrate, c) a laser crystallization system for simultaneously illuminating at least one sub-partial area of a currently coated partial area of the surface of the substrate with at least one laser beam, d) comprising a transport unit for transporting the substrate in a feedthrough direction from the supply opening to the discharge opening and for continuously or discontinuously moving the substrate during the coating thereof in the feedthrough direction.

However, some sputter processes necessitate repeatedly applying sputter material having a different or the same composition. For this purpose, a plurality of different sputter systems arranged in series are then necessary, but from a spatial standpoint they require a great deal of space. By contrast, if different sputter systems are arranged in a manner packed spatially close together, not only space but also energy is saved. In this case, however the substrate to be coated has to be rotated in order to pass again into the region of a further sputter system.

A transport device for the renewed coating of the same substrate in the same sputter system cannot be inferred from this known system from DE 10 2007 009 924 A1.

DE 695 04 716 T2 describes a device for handling substrates which is suitable for high vacuum and which has a rotating unit. A substrate carrier is inserted into the latter and transported by means of conveying means, e.g. rollers, to the individual processing chambers. Means for aligning the rotating unit and detection units for checking the sputter processes are not explicitly described here. Furthermore, said document is also not concerned with the problem of repeatedly applying sputter material having a different or the same composition. Therefore, DE 695 04 716 T2 does not reveal any suggestions for solving the problem addressed by the invention.

DE 197 15 151 A1 likewise describes a device that is used to transport a substrate carrier into a process chamber by means of a rotary/thrust mechanism. Said document is likewise not concerned with repeatedly applying sputter material.

DE 20 2008 004 228 U1, originating from the present applicant, discloses substrate carriers transported on rollers in clean rooms.

The particular problems of positioning substrates which are subjected to a repeated sputter process are not discussed therein.

Therefore, the device according to the invention, and the method according to the invention address the problem of enabling, when transporting large thin glass sheets to and from a sputter system under clean room conditions, a rotation that can be performed easily, a check of the first sputter process and a renewed supply to the same sputter system for repeatedly applying sputter material, or some other part of a production system.

This problem is solved by means of a device according to claim 1 and a method according to claim 6.

The device according to the invention is described in greater detail below.

Further aspects of this application will become readily apparent to persons skilled in the art after a review of the following description, with reference to the drawings and claims that are appended to and form a part of this specification.

In the figures:

FIG. 5 shows the device according to the invention in the assemblage of different guideways.

DETAILED DESCRIPTION

Figure 1:
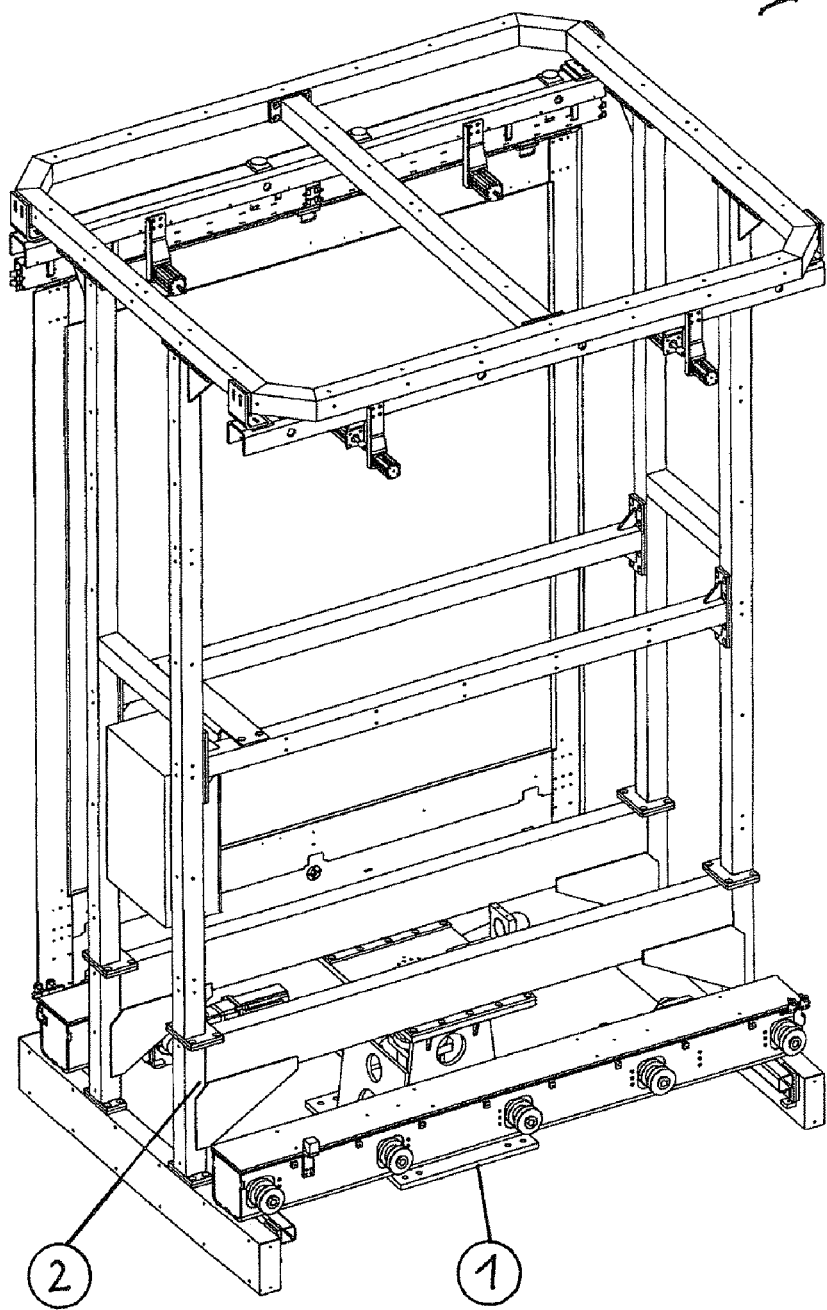
FIG. 1 shows a device according to the invention in perspective view.

FIG. 1 illustrates a device according to the invention in perspective view from the side of the possibility for detection of a substrate wafer. It substantially consists of a frame construction, of which the rotary base 1 for the rotating unit and the frame 2 of the rotating unit are designated in FIG. 1.

Figure 2:
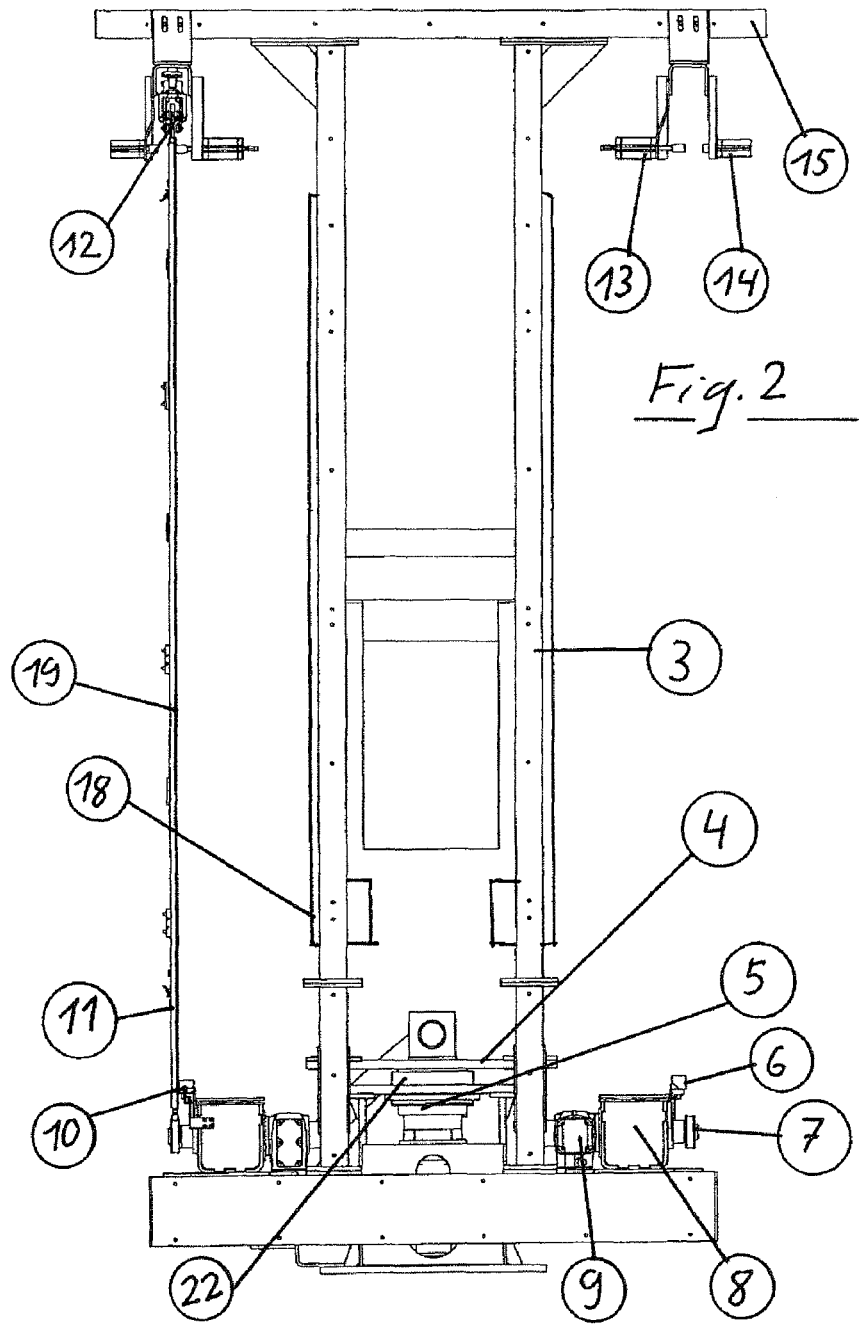
FIG. 2 shows a device according to the invention as seen from a side area.

FIG. 2 is a device according to the invention as viewed from a narrower side area. From the rotary base 1 for the rotating unit as shown in FIG. 1 the turntable 4 lying within the rotating unit can be discerned in the center, wherein a vertical support 3 of the rotating unit is respectively arranged on the left and right of the turntable 4 in this illustration, and wherein the right-hand vertical support bears the corresponding reference symbol. The gear mechanism 5 of the rotating unit is depicted below the turntable 4

Symmetrically with respect to the center line of the turntable 4, a transport roller drive 9, a transport roller carrier 8 illustrated in cross section, and a transport roller 7 mounted therein can be discerned in each case on the two vertical supports 3. As can be gathered from the illustration in FIG. 4, only one roller 7 on each side is respectively provided with a transport roller drive 9. Preferably, however, each of the four transport rollers 7 has a dedicated transport roller drive 9 (servo).

The left-hand side of FIG. 2 only illustrates a transport frame 11 with a substrate wafer 19 mounted therein in cross section. In this case, the transport frame 11 runs in the lower region on the left-hand transport roller 7, which is not designated here, and is guided in the upper region with its guide rail 12. In order to detect the position of the transport frame 11 in the region of the transport rollers 7, the rear position sensor 10 is used on the left-hand side in FIG. 2 and the front position sensor 6 on the right-hand side. Since, in the illustration in FIG. 2, the respective position sensors lie one behind another, only one sensor in each case was able to be shown here. On the right-hand side of FIG. 2, the rear fixing cylinders 13 and front fixing cylinders 14 fixed to the head frame 15 of the guiding and fixing device are illustrated, which here do not fix a transport frame. Said fixing cylinders are not designated on the left-hand side in FIG. 2, for reasons of clarity. A detection unit 18 is situated on each side of a vertical support 3, which, as can be discerned on the left-hand side of the illustration in FIG. 2, faces a transport frame 11 with a substrate wafer 19 grasped thereby. The detection unit 18 has the same area as a substrate wafer 19, which can be discerned in the illustration in FIG. 2 only from the height thereof, and has scanning elements which can check the result of the previous sputter process. The scanning elements can operate in the manner of a scanner or check the entire area of a substrate wafer 19 light-technologically. Illustrated below the turntable 4 is the contact-connection 22, which, on the one hand, enables an undisturbed rotation of the rotating unit and, on the other hand, ensures an interference-free transmission of the data supplied by the detection unit 18 and also the sensors and of general control data.

Figure 3:
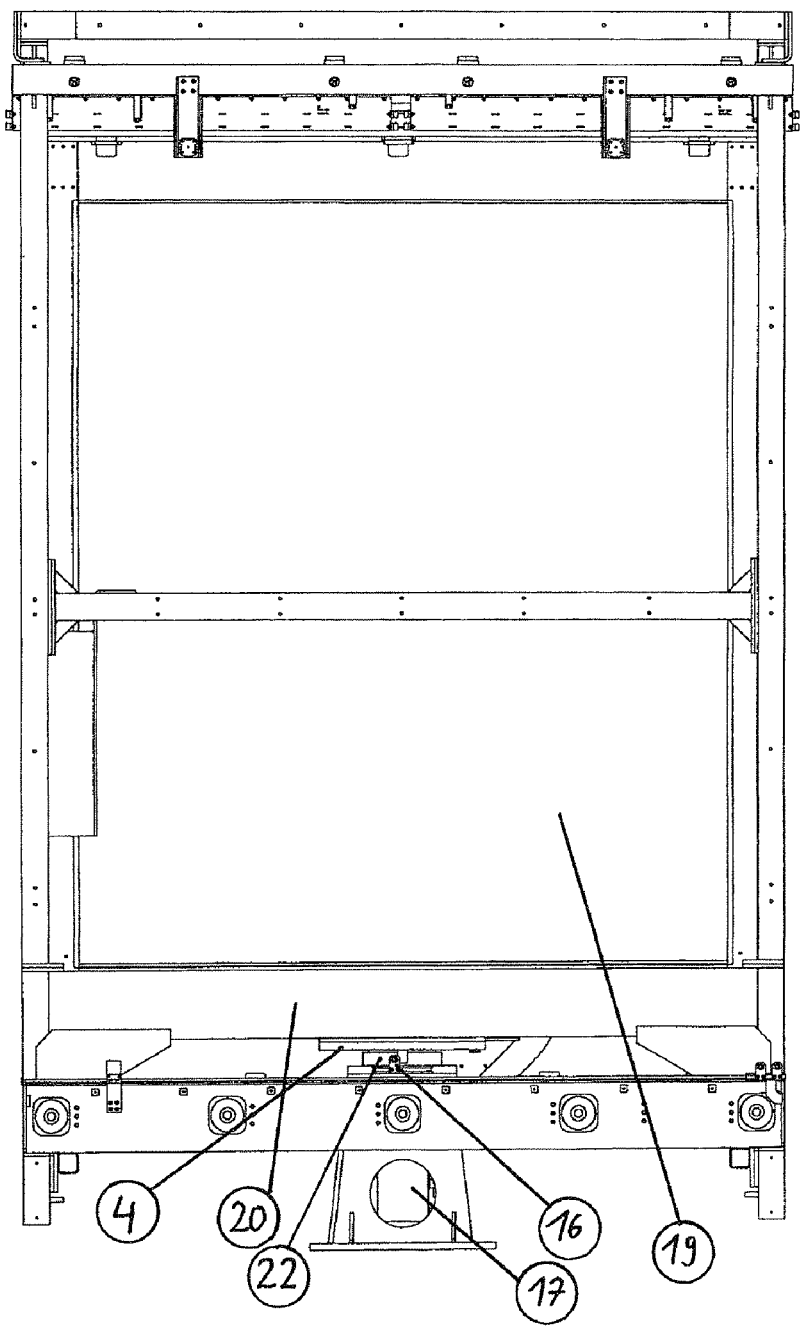
FIG. 3 shows a cross section of the device according to the invention.

FIG. 3 shows a cross section of the device according to the invention in a longitudinal direction. Besides the turntable 4 already described, the substrate wafer 19 as whole area and the contact-connection 22, here the illustration shows the rotary frame carrier 20 and the drive 17 for the rotating unit. Defined control of the rotating unit necessitates the rotary sensor 16 for detecting the angle of rotation.

Figure 4:
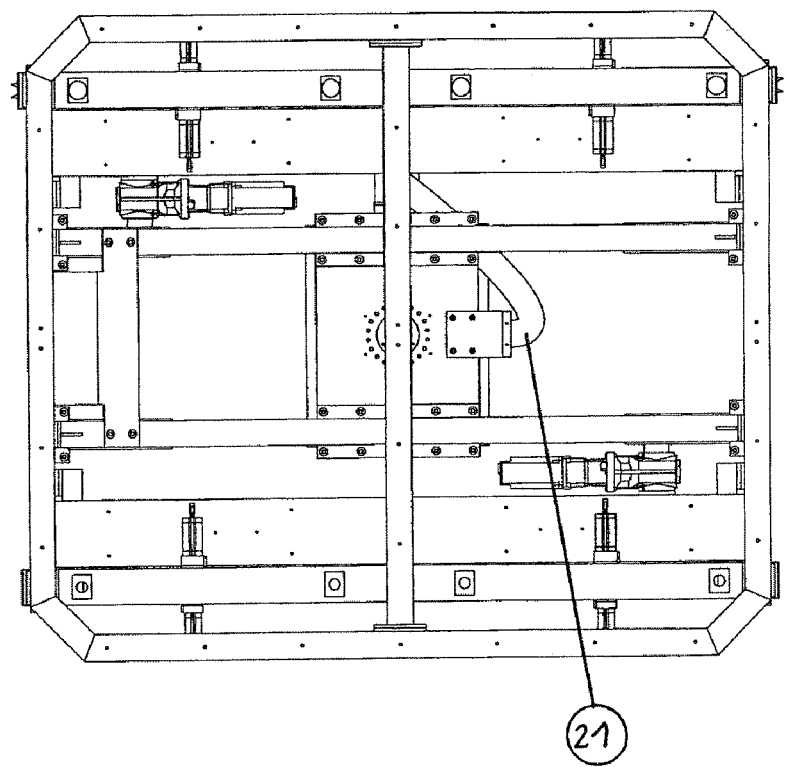
FIG. 4 shows a view from below.

FIG. 4 shows a view of the entire rotating unit from below. This illustration primarily reveals the supply tube 21 with the control cables and cables for electrical power supply.

FIG. 5 shows the device according to the invention in the assemblage of the guideways on which the transport frames 11 with the respective substrate wafers 19 are transported via the rotating unit for reversing the feeding of the sputter system 26. The two-track outgoing guideway 27 in this case firstly guides the substrate wafers 19 to the sputter system and then secondly guides the substrate wafers 19 that have finally completed the sputter process to the further production process again. The two-track guideway 25 guides the substrate wafers from and to the sputter system 26. All the guideways have transport rollers 7 at regular distances, which transport rollers can be driven in groups or else individually. For reasons of clarity, said transport rollers 7 are not illustrated in FIG. 5. Since the temperature differences between the sputter system 26 and hence the guideway 25, and the rotating unit can be very large, the sensors 23 and 24 are provided at this point. In this case, the sensors 23 detect the alignment of the guideway 25 with the respective guideway of the rotating unit. The sensors 24 additionally detect the thermal deformation of the two paths of the guideway 25. The same correspondingly applies to the guidance of the guide rail 12 of the respective transport frame 11. A separate illustration of the measures required here has been dispensed with since this is apparent to a person skilled in the art. Required corrections take place via a fine adjustment by means of the drive 17 of the rotating unit.

Further guideways 27 are depicted by way of example in the bottom left corner in FIG. 5. The double-headed arrow depicted in this region illustrates the fact that, in addition to the guideways 25, 26 described above, even further guideways 27 can be operated by the device according to the invention. This is significant primarily because high costs for obtaining the clean room conditions are incurred in a clean room and shortage of space therefore always prevails in such rooms. Therefore, the rotating unit shown as part of a larger system, can additionally serve as a linking station for numerous further process sequences. The possibility of precisely and rapidly aligning guideways in different directions for a transport frame 11 with a large substrate sheet 19 as charge is therefore an important field of use of the device according to the invention.

Overall, the measures described ensure that the transport frames 11 are transported from and to the sputter system 26 without warpage of such a frame and thus the risk of damage to a substrate wafer 19.

The complex control of the movement sequences described requires a special control program.

As a person skilled in the art will readily appreciate, the above description is meant as an illustration of implementation of the principles this application. This description is not intended to limit the scope or application of this invention in that the invention is susceptible to modification, variation and change, without departing from the spirit of this invention, as defined in the following claims.

LIST OF REFERENCE SYMBOLS (1) Rotary base for the rotating unit
(2) Frame of the rotating unit
(3) Vertical support of the rotating unit
(4) Turntable
(5) Gear mechanism of the rotating unit
(6) Front position sensor (rollers)
(7) Transport roller
(8) Transport roller carrier
(9) Transport roller drive (servomotor)
(10) Rear position sensor (rollers)
(11) Transport frame
(12) Guide rail
(13) Rear fixing cylinder
(14) Front fixing cylinder
(15) Head frame of the guiding and fixing unit
(16) Sensor for the angle of rotation and emergency stop
(17) Drive of the rotating unit (servomotor)
(18) Detection unit for the substrate wafer
(19) Substrate wafer
(20) Rotary frame carrier
(21) Supply tube
(22) Contact-connection
(23) Sensor for detecting the alignment of a guideway
(24) Sensor for detecting thermal deformations
(25) Guideway
(26) Sputter system
(27) Outgoing guideway

The invention claimed is:

1. A device for reversing the feeding of a sputter coating system for the purpose of repeatedly applying sputter material having a different or the same composition, in clean rooms, comprising the following features:
   a) a transport frame for receiving a substrate wafer,
   b) a rotating unit having means for rotating the transport frame and having means for transporting the transport frame onto different guideways,
   c) means for aligning the rotating unit with respect to the sputter coating system,
   d) a detection unit for checking a sputter process,
   e) means for mounting the transport frame, comprising a rear fixing cylinder and a front fixing cylinder in an upper region two transport rollers in a lower region, wherein the rollers are each provided with a dedicated servodrive and mechanically moved parts are encapsulated in an emission-free manner and produced from abrasion-resistant material.

2. The device as claimed in claim 1, wherein the means for rotating the transport frame comprise a servomotor in conjunction with a sensor for detecting the angle of rotation.

3. The device as claimed in claim 1, wherein the means for transporting the transport frame comprise guideways equipped with transport rollers at regular distances in the lower region, wherein fixing cylinders installed at regular distances in the upper region supplement the guidance by the transport rollers.

4. The device as claimed in claim 1, wherein the means for aligning the rotating unit with respect to the respective guideway are controlled by an adjustment of the drive of the rotating unit on the basis of measurement values determined from sensors, wherein the sensors additionally detect the thermal deformation of the paths of the guideway.

5. The device as claimed in claim 1, wherein the positioning of the substrate wafer is additionally monitored by lasers or corresponding sensors.

6. A method for reversing the feeding of a sputter coating system, for the purpose of repeatedly applying sputter material having a different or the same composition, in clean rooms, comprising the following features:

a) a substrate wafer to be coated is conveyed by a transfer device into a transport frame and then into a rotating unit,
b) the transport frame is mounted in the rotating unit by in each case two fixing cylinders on the left and right in the upper region, and also by the mount on transport rollers in the lower region on the left and right,
c) the transport frame is rotated by a drive incorporated in the frame of the rotating unit,
d) the transport frame is transported by transport roller drives that can guide on guideways in different directions,
e) the rotating unit is aligned with respect to the guideways by the sensors via the drive of the rotating unit,
f) a sputter process is checked by detection units, wherein the checking of the sputter process is present at least in the rotating unit of a transport frame and spacer elements being configured to operate in the manner of a scanner or being configured to check the entire area of a substrate wafer concurrently.

7. The method as claimed in claim 6, wherein the positioning of the substrate wafer is additionally monitored by means of lasers and/or corresponding sensors.

8. The method as claimed in claim 6, wherein in order to obtain the clean room conditions, mechanically moved parts are encapsulated in an emission-free manner and are produced form abrasion-resistant material.

9. The method as claimed in claim 6, wherein the rotating unit additionally serves as a linking station for numerous further process sequences.

10. A device for reversing the feeding of a sputter coating system for the purpose of repeatedly applying sputter material having a different or the same composition, in clean rooms, comprising the following features:
a) a transport frame for receiving a substrate wafer,
b) a rotating unit configured to rotate the transport frame and transport the transport frame onto different guideways,
c) an alignment unit configured to align the rotating unit with respect to the sputter coating system,
d) a detection unit for checking a sputter process,
e) a mounting unit configured to mount the transport frame, the mounting unit comprising a first fixing cylinder and a second fixing cylinder in a first region, and two transport rollers in a second region, wherein the rollers are each provided with a dedicated drive.

11. The device as claimed in claim 10, wherein the rotating unit comprises a servomotor in conjunction with a sensor for detecting the angle of rotation.

12. The device as claimed in claim 10, wherein the transport unit comprises guideways equipped with transport rollers at regular distances in the second region, wherein fixing cylinders installed at regular distances in the first region supplement the guidance by the transport rollers.

13. The device as claimed in claim 10, wherein the alignment unit is controlled by an adjustment of a drive of the rotating unit on the basis of measurement values determined from sensors, wherein the sensors additionally detect the thermal deformation of paths of the guideway.

14. The device as claimed in claim 10, wherein the positioning of the substrate wafer is additionally monitored by lasers or corresponding sensors.

* * * * *